United States Patent
Kim et al.

(10) Patent No.: US 9,568,558 B2
(45) Date of Patent: Feb. 14, 2017

(54) APPARATUS AND METHOD FOR CONTROLLING CONVERTER

(71) Applicant: Hyundai Motor Company, Seoul (KR)

(72) Inventors: Sung-Tae Kim, Gyeonggi-Do (KR); Chang-Ryeol Yoo, Incheon (KR)

(73) Assignee: Hyundai Motor Company, Seoul (KR)

( * ) Notice: Subject to any disclaimer, the term of this patent is extended or adjusted under 35 U.S.C. 154(b) by 249 days.

(21) Appl. No.: 14/562,681

(22) Filed: Dec. 6, 2014

(65) Prior Publication Data

US 2016/0084916 A1    Mar. 24, 2016

(30) Foreign Application Priority Data

Sep. 24, 2014    (KR) .................... 10-2014-0127395

(51) Int. Cl.
| | | |
|---|---|---|
| *H02J 7/00* | (2006.01) | |
| *H02J 7/04* | (2006.01) | |
| *G01R 31/36* | (2006.01) | |
| *G01R 19/00* | (2006.01) | |
| *B60L 9/00* | (2006.01) | |

(52) U.S. Cl.
CPC ....... *G01R 31/3675* (2013.01); *G01R 31/3634* (2013.01); *H02J 7/007* (2013.01)

(58) Field of Classification Search
CPC .................................................. G01R 31/3675
USPC ........ 320/109, 132, 152; 702/57, 58, 60, 63, 702/64, 65; 701/22
See application file for complete search history.

(56) References Cited

U.S. PATENT DOCUMENTS

| | | | | |
|---|---|---|---|---|
| 6,388,447 | B1* | 5/2002 | Hall ..................... | H02J 7/0047 324/426 |
| 7,634,369 | B2* | 12/2009 | Lim ..................... | H02J 7/0029 320/130 |
| 7,652,448 | B2* | 1/2010 | Palladino .............. | H01M 10/48 320/104 |
| 8,222,862 | B2* | 7/2012 | Ichikawa ............ | B60L 11/1816 320/116 |
| 9,316,693 | B2* | 4/2016 | Benjamin .......... | G01R 31/3606 |

FOREIGN PATENT DOCUMENTS

| | | |
|---|---|---|
| JP | 2000-299939 A | 10/2000 |
| JP | 2002-238181 A | 8/2002 |
| JP | 2004-048854 A | 2/2004 |

(Continued)

*Primary Examiner* — Richard V Muralidar
(74) *Attorney, Agent, or Firm* — Mintz Levin Cohn Ferris Glovsky and Popeo, P.C.; Peter F. Corless

(57) ABSTRACT

An apparatus and method for controlling a converter are provided. The apparatus includes a battery and a sensor configured to sense the battery to generate sensor state of battery information. A converter controller is configured to acquire the sensor state of battery information and vehicle state information received from a vehicle controller to calculate calibrated state of battery information based on whether a correction execution condition on the sensor state of battery information is satisfied. In addition, the converter controller uses the calibrated state of battery information and the sensor state of battery information to calculate an error correction value and uses the error correction value to calculate actual state of battery information. A converter is then configured to supply power to the battery based on the sensor state of battery information or the actual state of battery information.

20 Claims, 8 Drawing Sheets

(56) References Cited

FOREIGN PATENT DOCUMENTS

| | | |
|---|---|---|
| JP | 2010-035280 A | 2/2010 |
| JP | 2011-127958 A | 6/2011 |
| KR | 10-2001-0059081 A | 7/2001 |
| KR | 10-2010-0008038 A | 1/2010 |
| KR | 10-2013-0030520 A | 3/2013 |
| KR | 10-2013-0116419 A | 10/2013 |

* cited by examiner

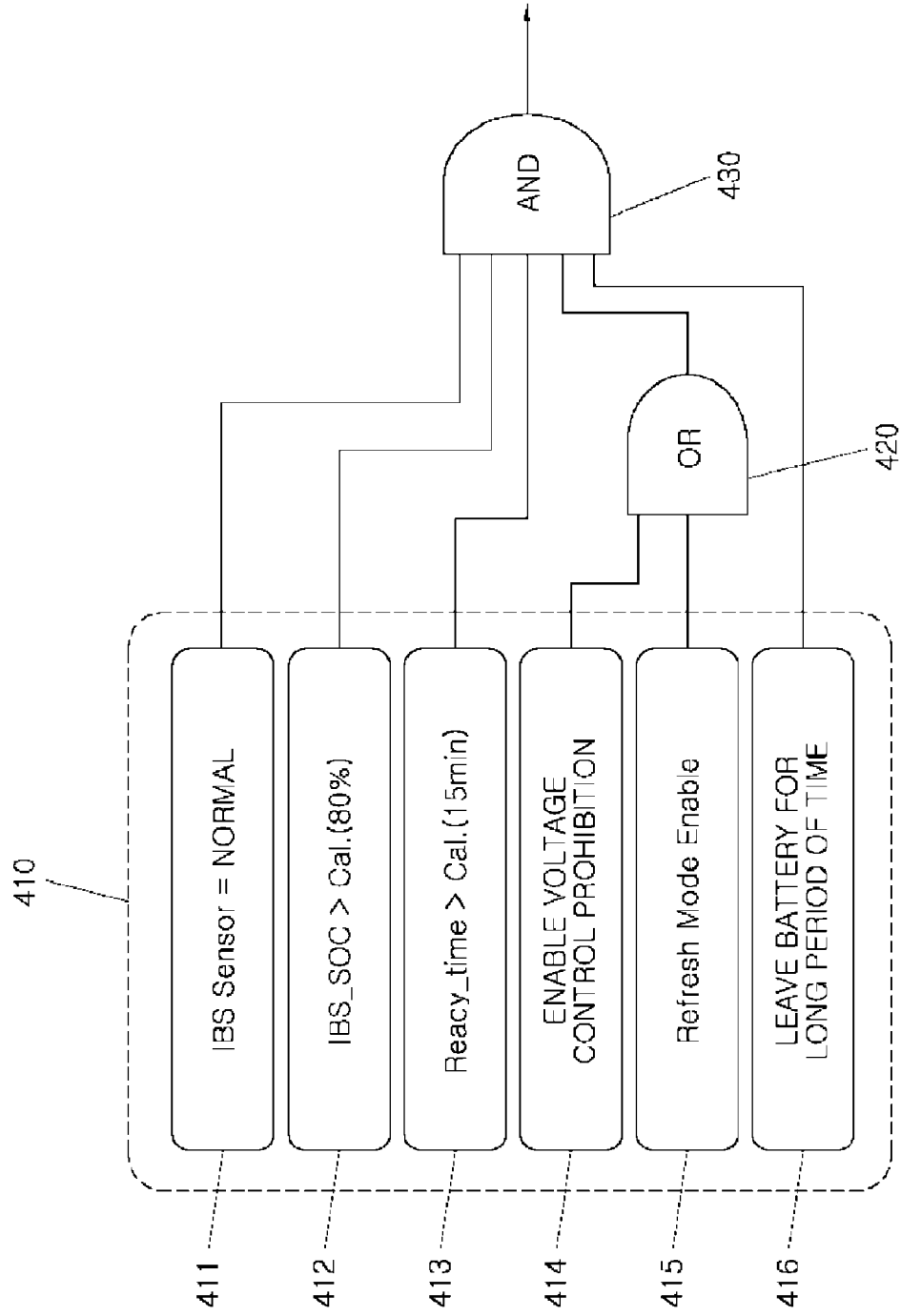

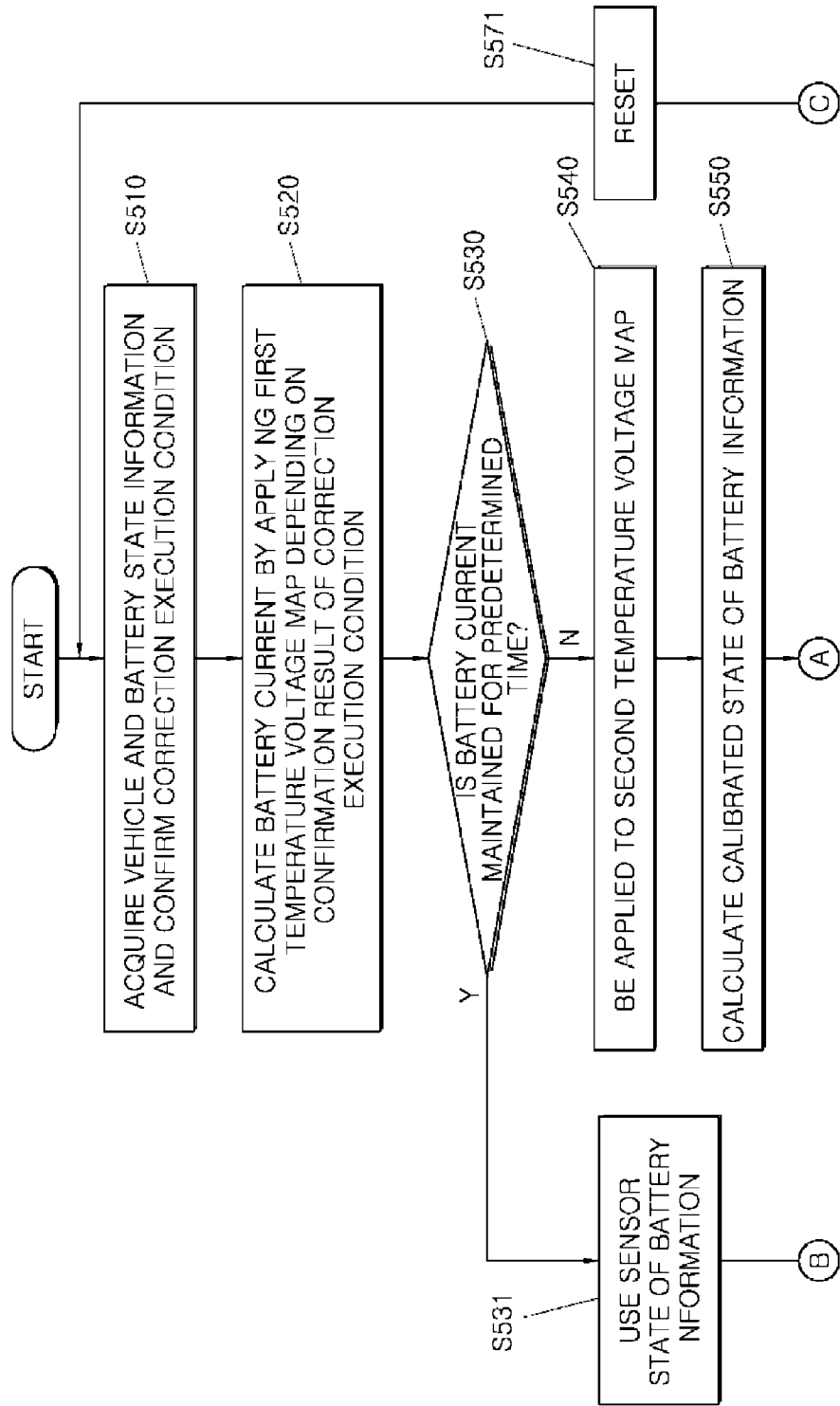

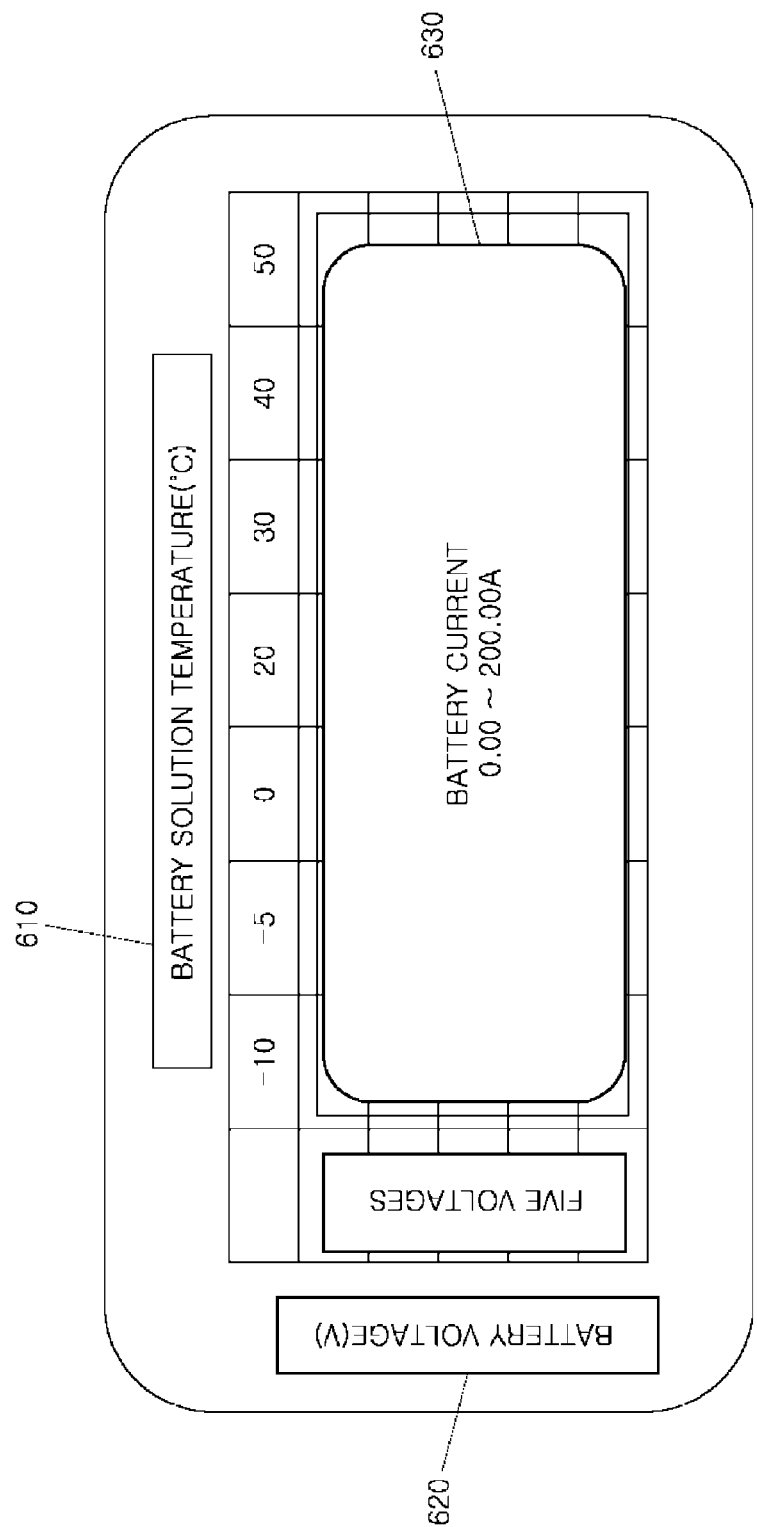

APPARATUS AND METHOD FOR CONTROLLING CONVERTER

CROSS-REFERENCE TO RELATED APPLICATIONS

This application claims the benefit of priority to Korean Patent Application No. 10-2014-0127395 filed on Sep. 24, 2014, the entire contents of which are incorporated herein by reference.

TECHNICAL FIELD

The present inventive concept relates to a technology of calculating battery information, and more particularly, to an apparatus and a method for controlling a converter to improve accuracy of state of battery information regarding an auxiliary battery using detailed conditions of a specific correction value while a vehicle is being driven.

BACKGROUND

A vehicle using an internal combustion engine uses gasoline or heavy oil as main fuel which causes pollutions such as air pollution. Recently, therefore, to reduce such pollutions, environmentally friendly vehicles have been developed. The eco-friendly or environmentally friendly vehicle is a type of vehicle that uses a battery engine operated by electric energy output from a battery. The eco-friendly vehicle uses a battery pack, in which a plurality of secondary battery cells which may be charged and discharged are formed in one pack, as a main power source. Therefore, the eco-friendly vehicle prevents the discharge or exhaust gas and generates minimal noise.

In particular, to supply power output to the battery pack to an auxiliary battery, the eco-friendly vehicle includes a low voltage direct current-direct current (DC-DC) converter (LDC), a converter controller configured to operate the LCD, a sensor configured to sense the auxiliary battery to generate state of battery information. However, a voltage control effect of the low voltage converter may not be constant due to errors of the state of battery information (e.g., state of charge (SOC)) generated by the sensor. In other words, the SOC generated by the sensor (e.g., intelligent battery sensor (IBS)) is 85% and a fuel efficiency effect is 1%, but actually, the SOC is 75% and the fuel efficiency effect is only 0.5%. Further, durability performance of the battery may be reduced. For example, the SOC generated by the sensor is 80 to 100% and durability cycle lifespan is 100%, but actually, the SOC is 70 to 100% and the durability cycle lifespan is only 90%.

SUMMARY

An aspect of the present invention provides an apparatus and a method for controlling a converter that may more accurately calculate state of battery information by correcting errors of the state of battery information generated by a sensor. Another aspect of the present invention provides an apparatus and a method for controlling a converter to improve durability performance of a battery.

Other objects and advantages of the present inventive concept may be understood by the following description, and become apparent with reference to the embodiments of the present invention. Also, it is obvious to those skilled in the art to which the present inventive concept pertains that the objects and advantages of the present inventive concept can be realized by the means as claimed and combinations thereof.

An aspect of the present invention provides an apparatus for controlling a converter that more accurately calculates state of battery information by correcting an error of the state of battery information generated by a sensor. The apparatus for controlling a converter may include: a battery; a sensor configured to sense the battery to generate sensor state regarding battery information; a converter controller configured to acquire the sensor state of battery information and vehicle state information received from a vehicle controller to calculate calibrated state of battery information based on whether a correction execution condition on the sensor state of battery information is satisfied, use the calibrated state of battery information and the sensor state of battery information to calculate an error correction value, and use the error correction value to calculate actual state of battery information; and a converter configured to supply power to the battery based on the sensor state of battery information or the actual state of battery information.

The converter controller may include: a calibration state of battery information calculator configured to use a preset temperature voltage map based on whether the correction execution condition is satisfied to calculate the calibrated state of battery information; an error correction value calculator configured to use the calibrated state of battery information and the sensor state of battery information to calculate the error correction value; and an actual state of battery information calculator configured to use the error correction value and the sensor state of battery information to calculate the actual state of battery information.

The calibration state of battery information calculator may include: a first temperature voltage map configured to calculate a battery current of the battery; a monitoring unit configured to determine whether the battery current is maintained for a predetermined period of time; and a second temperature voltage map configured to calculate the calibrated state of battery information when the battery current is maintained for a predetermined period of time. The correction execution condition may include whether a sensor is operated normally (e.g., without failure), whether the sensor state of battery information is equal to or greater than a specific value, whether a ready time to activate the battery is equal to or greater than a specific time, whether voltage control prohibition is enabled, whether a refresh mode is enabled, and whether a battery long-term leaving mode is set.

The battery may be an auxiliary battery. The error correction value may be a value obtained by subtracting the sensor state of battery information from the calibrated state of battery information. The sensor may be an intelligent battery sensor (IBS). The first temperature voltage map may be a battery current which matches a battery solution temperature of the battery and a battery voltage. The second temperature voltage map may be the calibrated state of battery information which matches the battery solution temperature of the battery and the battery voltage. The sensor state of battery information, the calibrated state of battery information, and the actual state of battery information may be any one of a state of charge (SOC), a state of health (SOH), a depth of discharge (DOD), and a state of function (SOF). The converter may be a low voltage DC-DC converter (LDC).

Another aspect of the present invention relates to a method for controlling a converter that may include: sensing, by a sensor, a sensor state of battery information regarding a battery; acquiring, by a converter controller, vehicle state information from a vehicle controller; confirming, by the converter controller, whether a correction execution condition on the sensor state of battery information is satisfied using the sensor state of battery information and the vehicle state information; calculating, by the converter controller, calibrated state of battery information using the sensor state of battery information based on whether the correction execution condition is satisfied; calculating, by the converter controller, an error correction value using the calibrated state of battery information and the sensor state of battery information; calculating, by the converter controller, actual state of battery information using the error correction value; and supplying, by a converter, power to the battery based on the sensor state of battery information or the actual state of battery information.

The calculation of the calibrated state of battery information may include: calculating the calibrated state of battery information using a preset temperature voltage map in response to confirming that the correction execution condition is satisfied; and using the sensor state of battery information as actual state of battery information in response to confirming that the correction execution condition is not satisfied. In addition, the calculation of the calibrated state of battery information may include: calculating a battery current of the battery using a first temperature voltage map; confirming whether the battery current is maintained for a predetermined period of time using a monitoring unit; and calculating the calibrated state of battery information when the battery current is maintained for a predetermined period of time using a second temperature voltage map.

BRIEF DESCRIPTION OF THE DRAWINGS

The above and other features of the present invention will now be described in detail with reference to exemplary embodiments thereof illustrating the accompanying drawings which are given herein below by way of illustration only, and thus are not limitative of the present invention, and wherein:

FIG. 4 is an exemplary detailed configuration diagram of a condition satisfaction determiner illustrated in FIG. 2 in accordance with an exemplary embodiment of the present invention;

FIGS. 5A and 5B are exemplary flow charts illustrating a process of improving accuracy of state of battery information in accordance with an exemplary embodiment of the present inventive concept;

FIG. 6 is an exemplary conceptual diagram of a first temperature voltage map illustrated in FIG. 2 in accordance with an exemplary embodiment of the present invention.

DETAILED DESCRIPTION

Figure 1:
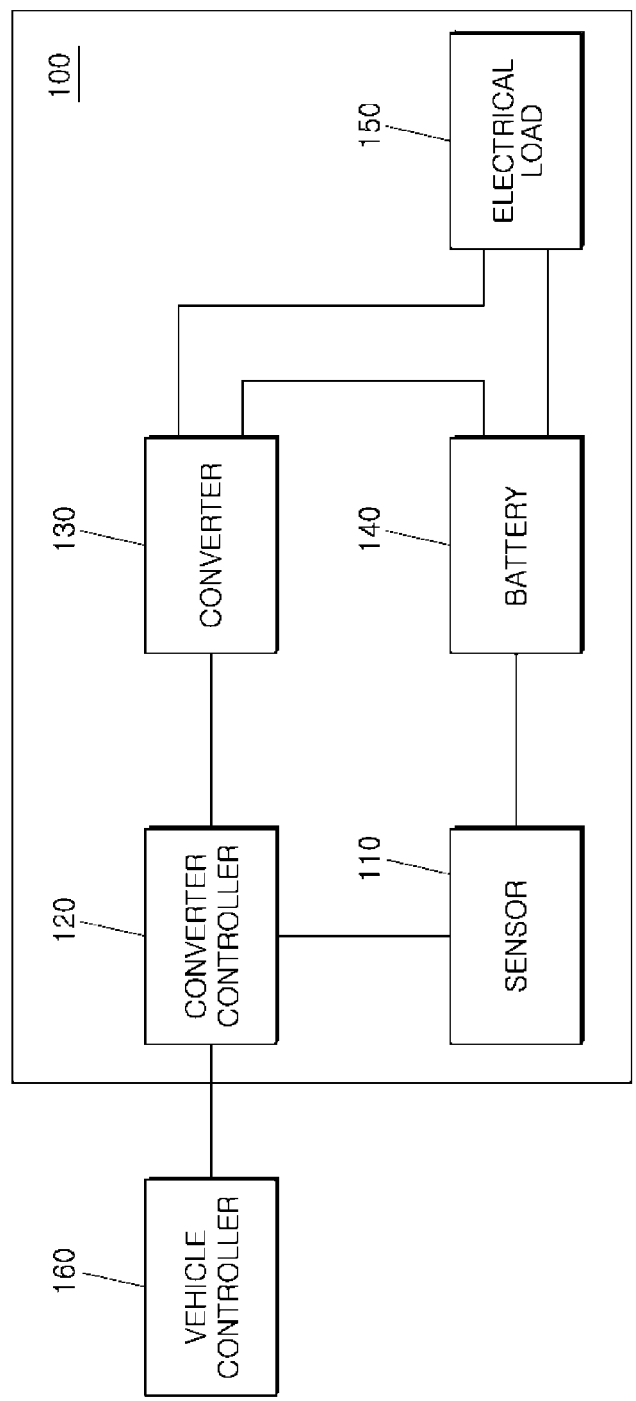
FIG. 1 is an exemplary configuration diagram of an apparatus for controlling a converter which improves accuracy of state of battery information in accordance with an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Since the present inventive concept may be variously modified and have several exemplary embodiments, specific exemplary embodiments will be shown in the accompanying drawings and be described in detail in a detailed description. However, it is to be understood that the present invention is not limited to the specific exemplary embodiments, but includes all modifications, equivalents, and substitutions included in the spirit and the scope of the present inventive concept. Throughout the accompanying drawings, the same reference numerals will be used to describe the same components. Terms used in the specification, 'first', 'second', etc., may be used to describe various components, but the components are not to be construed as being limited to the terms. That is, the terms are used to distinguish one component from another component. For example, the 'first' component may be named the 'second' component and the 'second' component may also be similarly named the 'first' component, without departing from the scope of the present invention.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, an apparatus and a method for controlling a converter in accordance with an exemplary embodiment of the present invention will be described in detail with reference to the accompanying drawings.

FIG. 1 is an exemplary configuration diagram of an apparatus 100 for controlling a converter which may improve accuracy of state of battery information in accordance with an exemplary embodiment of the present invention. Referring to FIG. 1, the apparatus 100 for controlling a converter may include a battery 140, a sensor 110 configured to sense the battery 140, a converter controller 120 configured to operate charging and/or discharging of the battery using sensing information from the sensor 110, and a converter 130 configured to supply power to the battery 140 based on the control of the converter controller 120.

The sensor 110 may be configured to sense the battery 140 to generate sensor state of battery information. The sensor 110 may use an intelligent battery sensor (IBS) but is not limited thereto, and therefore, may be a current sensor, a voltage senor, or a combination thereof. An example of the sensor state of battery information may include a state of charge (SOC), a state of health (SOH), a depth of discharging (DOD), a state of function (SOF), and the like. To help understanding, the exemplary embodiment of the present invention will describe a correction example using the SOC. However, the correction example according to the present invention may also be applied to the SOH, the DOD, the SOF, and the like. The SOC may be calculated using a current and a voltage of a battery and the SOH, the SOF, and the like may be calculated using the SOC. Therefore, in accordance with the exemplary embodiment of the present invention, even for calibrated state of battery information and actual state of battery information, the SOC will be described.

Figure 2:
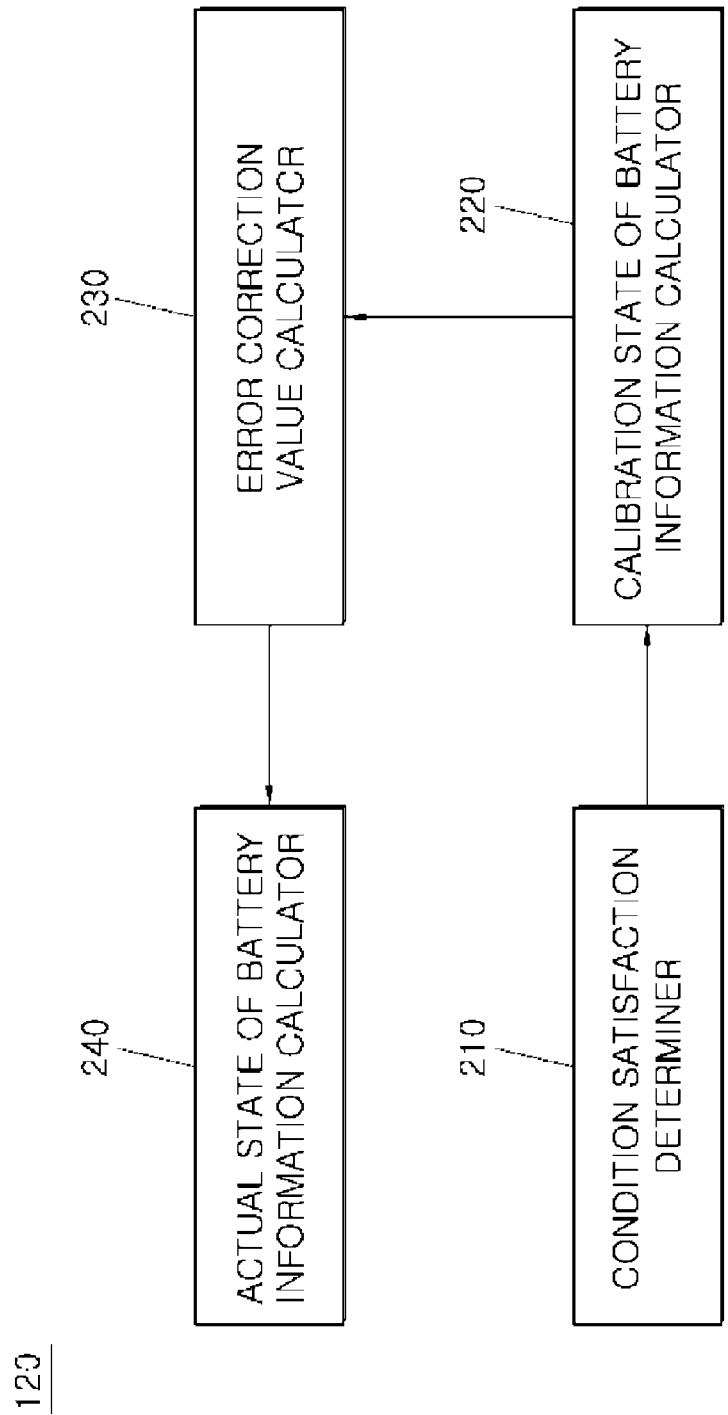
FIG. 2 is an exemplary detailed configuration diagram of a converter controller illustrated in FIG. 1 in according with an exemplary embodiment of the present invention.

The converter controller 120 may be configured to perform correction using the sensor state of battery information (SOC) and vehicle state information received from a vehicle controller 160. In particular, FIG. 2 illustrates a detailed configuration of the converter controller 120 which will be described below. Referring continuously to FIG. 1, the converter 130 may be configured to convert power from a high voltage battery (not illustrated) based on the converter controller 120 and supply the power to the battery 140. For the converter 130, a low voltage DC-DC converter (LDC) may be used. Further, the converter 130 may also be configured to supply power to an electrical load 150 disposed within a vehicle.

The battery 140 may be configured to perform charging and/or discharging and supply power to the electrical load 150. The battery 140 may be a chargeable auxiliary battery of about 12 V but the exemplary embodiment of the present invention is not limited thereto, and therefore may also be a high voltage battery by a design change and/or modification.

The vehicle controller 160 may be configured to generally execute starting, driving, and the like of a vehicle, generate vehicle state information, and transmit the generated vehicle state information to the converter controller 120. An example of the vehicle to which the apparatus 100 for controlling a converter in accordance with the exemplary embodiment of the present invention may include a hybrid electric vehicle (HEV), a plug-in hybrid electric vehicle (PHEV), an electric vehicle (EV), a neighborhood electric vehicle (NEV), a fuel-cell vehicle (FCV), a clean diesel vehicle (CDV), and the like.

FIG. 2 is an exemplary detailed configuration diagram of the converter controller 120 illustrated in FIG. 1. Referring to FIG. 2, the converter controller 120 may include a condition satisfaction determiner 210, a calibration state of battery calculator 220, an error correction value calculator 230, an actual state of battery information calculator 240, and the like.

In particular, the condition satisfaction determiner 210 may be configured to receive the vehicle state information from the vehicle controller 160 (FIG. 1) and the sensor state of battery information IBS_SOC generated by the sensor 110 (FIG. 1) to determine whether to perform a correction on the sensor state of battery information. Generally, the starting of the vehicle may be keyed off and then the sensor 110 (FIG. 1) may be configured to be recalibrated to generate the sensor state of battery information IBS_SOC. Particularly, an error of the SOC may be about ±10% based on an open circuit voltage (OCV). In accordance with the exemplary embodiment of the present invention, the SOC accuracy may be increased to about ±3% to 5% by additionally correcting the recalibrated sensor state of battery information IBS_SOC in a ready condition of a vehicle.

The calibration state of battery information calculator 220 may be configured to calculate calibrated state of battery information SOC (Cal) using a preset temperature voltage map based on whether the correction execution condition is satisfied. The error correction value calculator 230 may be configured to calculate an error correction value SOC_Offset using the calibrated state of battery information SOC (Cal) and the state of battery information IBS_SOC. A calculation equation of the error correction value is as the following Equation 1.

$$SOC\_Offset = SOC(Cal) - IBS\_SOC \qquad \text{Equation 1}$$

The error correction value may not be calculated up to the following event time. Further, the actual state of battery information calculator 240 may be configured to calculate actual state of battery information SOC_Actual using the error correction value SOC_Offset and the sensor state of battery information IBS_SOC.

Figure 3:
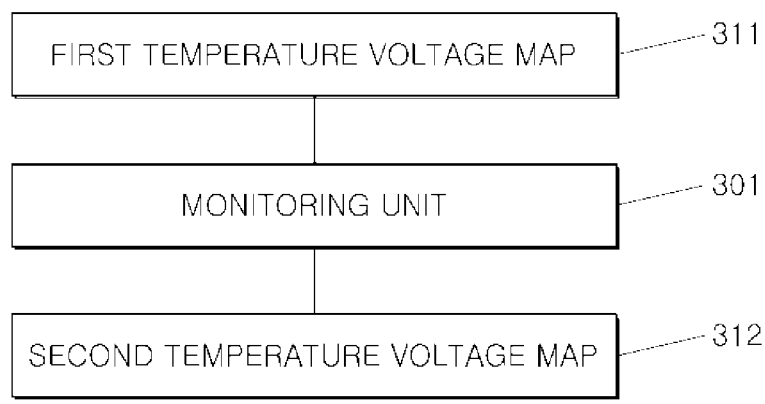
FIG. 3 is an exemplary detailed configuration diagram of a calibration state of battery information calculator in accordance with an exemplary embodiment of the present invention.

FIG. 3 is an exemplary detailed configuration diagram of the calibration state of battery information calculator 230 illustrated in FIG. 2. Referring to FIG. 3, the calibration state of battery information calculator 230 may include a first temperature voltage map 311 configured to calculate a battery current IBS_Current of the battery 140 (FIG. 1), a monitoring unit 301 configured to confirm whether the battery current IBS_Current is maintained for a predetermined period of time, a second temperature voltage map 312 configured to calculate the calibrated state of battery information when the battery current IBS_Current is maintained for a predetermined period of time, and the like. The first temperature voltage map 311 may be configured to calculate the battery current IBS_Current which substantially matches a battery solution temperature (° C.) of the battery 140 and a battery voltage V. The second temperature voltage map 312 may be configured to calculate the calibrated state of battery information SOC (Cal) which substantially matches the battery solution temperature (° C.) of the battery 140 and the battery voltage V.

The monitoring unit 301 may be configured to monitor whether the battery current IBS_Current is maintained for a predetermined period time when the battery current IBS_Current is less than a preset threshold value. In other words, the battery current IBS_Current may be continuously changed in real time, and therefore when a value of the battery current IBS_Current is maintained for a predetermined period of time, the correction may be performed. Therefore, when the battery current is not maintained for a predetermined period of time, the sensor state of battery information may be used. Further, when the battery current is required to be maintained for a predetermined period of time in the state in which the battery current is less (IBS_Current<Cal) than a specific value, the correction may be performed.

FIG. 4 is an exemplary detailed configuration diagram of the condition satisfaction determiner 220 illustrated in FIG. 2. Referring to FIG. 4, the condition satisfaction determiner 220 may include a condition information acquirer 410 configured to acquire correction execution condition information, an OR gate 420, and an AND gate 430 logically combining the condition information, and the like.

The correction execution condition information 410 may include information 411 regarding whether the sensor is operated normally (e.g., without failure), information 412 regarding whether the sensor state of battery information is equal to or greater than a specific value, information 413 regarding whether a ready time to activate the battery is equal to or greater than a specific time, information 414 regarding whether voltage control prohibition is enabled, information 415 regarding whether a refresh mode is enabled, information 416 regarding whether a battery long-term leaving mode is set, and the like.

The information 411 regarding whether the sensor is operated normally may determine whether the sensor 110 (FIG. 1) is normal to indicate that when the sensor is normal, the correction may be performed and when the sensor communication is not possible (e.g., a sensor error is present or the sensor has failed), the correction may not be performed. The information 412 regarding whether the sensor state of battery information is equal to or greater than a specific value indicates that when the state of charge (SOC) is equal to or greater than about 80%, the correction may be performed and when the SOC is equal to or less than about 80%, the voltage control of the converter 130 (FIG. 1) may not be performed and therefore the correction execution may not be required.

The information 413 regarding whether the ready time to activate the battery is equal to or greater than a specific time indicates that when Ready_time>specific value (Col. about 15 min), the correction may be performed. Generally, the ready time may be the start of mass-produced vehicles and may be a minimum time required to activate the battery. Therefore, a charging and discharging state of a battery prior to about 15 minutes may have non-linear characteristics and therefore may be required to be calculated after a minimum of about 15 minutes. Further, the charging and discharging state may be affected by characteristics of the battery, and therefore the specific value should be reflected in consideration of an increase in time based on a test result.

The information 414 regarding whether the voltage control prohibition is enabled and the information 415 regarding whether the refresh mode is enabled indicate that the correction may be performed in the battery charging condition. When the voltage control prohibition and the refresh mode are enabled, a charging voltage (e.g., about 14.0 V at about 23° C.) may be used. Additionally, the information 416 regarding whether the battery long-term leaving mode is set indicates that the correction execution operation is not progressed independent of all of the above-mentioned conditions. In other words, the battery long-term leaving may cause a sulfation phenomenon of a battery plate and it may be difficult to determine the state of battery based on the charging of the battery for a substantially short period of time.

Figure 5B:
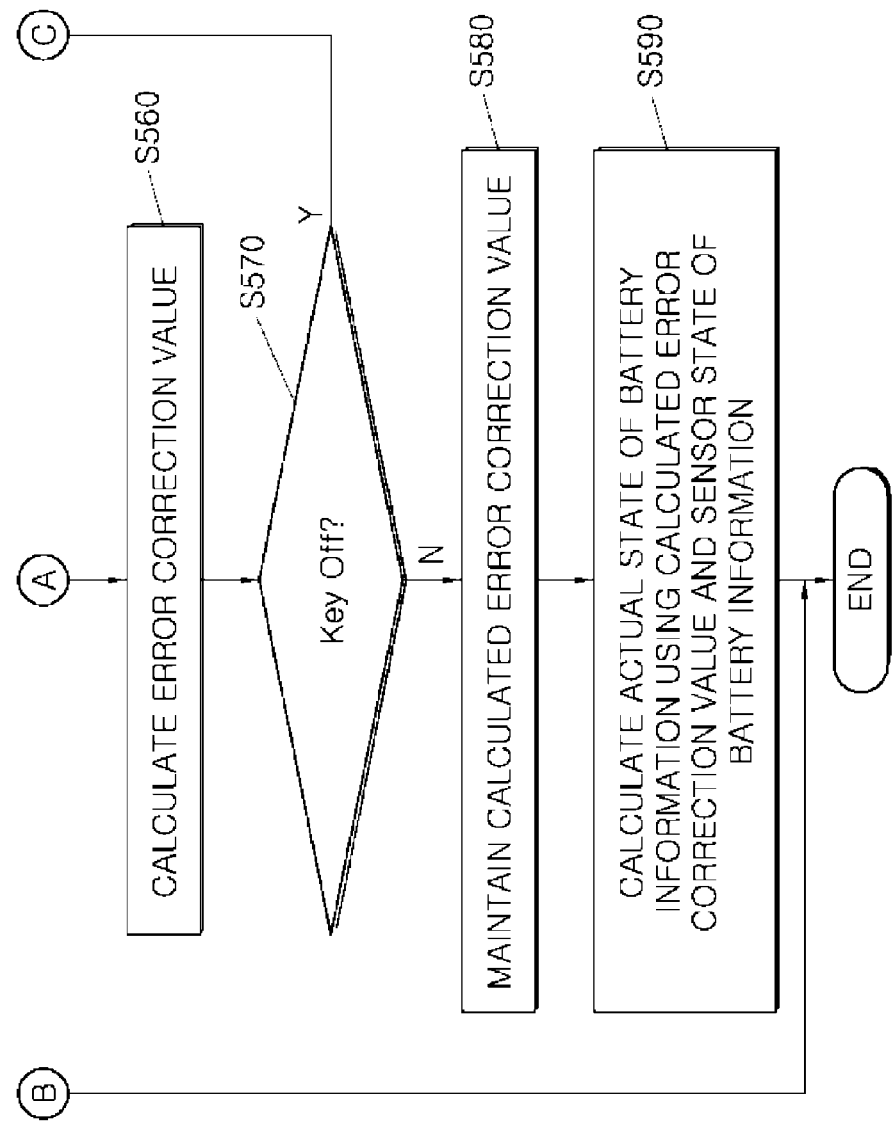

FIGS. 5A and 5B are exemplary flow charts illustrating a process of improving accuracy of state of battery information in accordance with an exemplary embodiment of the present invention. Referring to FIGS. 5A and 5B, the sensor 110 may be configured to sense the battery 140 to generate the sensor state of battery information and transmit the generated sensor state of battery information to the converter controller 120. In addition, the converter controller 120 may be configured to acquire the vehicle state information from the vehicle controller 160.

The converter controller 120 may be configured to use the acquired sensor state of battery information and/or the vehicle state information to confirm whether the correction execution condition on the sensor state of battery information is satisfied (step S510). In response to confirming that the correction execution condition is satisfied, the first temperature voltage map may be applied to calculate the battery current (step S520). Further, in response to confirming that the correction execution condition is not satisfied, the correction execution condition may not be progressed and the sensor state of battery information may be used.

When the battery current is calculated, the converter controller 120 may be configured to determine whether the battery current is maintained for a predetermined time (step S520). As a result, when the battery current is maintained substantially constant, the second temperature voltage map may be applied to calculate the calibrated state of battery information and the calibrated state of battery information and the sensor battery state information may be used to calculate the error correction value (steps S540, S550, and S560).

Further, in step S530, when the battery current is not maintained substantially constant, the correction execution operation may not be progressed and the sensor state of battery information may be used (step S531). After step S560, whether there is the key off may be determined (step S570). In response to determining the key off, the calculated error correction value according to the steps S510 to S560 may be reset and thus the steps S510 to S570 may restart (step S571). In response to determining no key off, the calculated error correction value may be maintained and the error correction value and the sensor state of battery information may be summed (e.g., added) to calculate the actual state of battery information (step S580, S590). The converter 130 may then be configured to supply power to the battery 140 based on the sensor state of battery information or the actual state of battery information under the control of the converter controller 120.

FIG. 6 is an exemplary conceptual diagram of the first temperature voltage map 311 illustrated in FIG. 2. Referring to FIG. 6, a battery solution temperature 610 is indicated in a horizontal direction and a battery voltage 620 is indicated in a vertical direction. A combination of the battery solution temperature 610 and the battery voltage 620 may be matched with a corresponding battery current 630. In the case of FIG. 6, the number of the battery voltage 620 is five and values therebetween are processed by linear interpolation.

Figure 7:
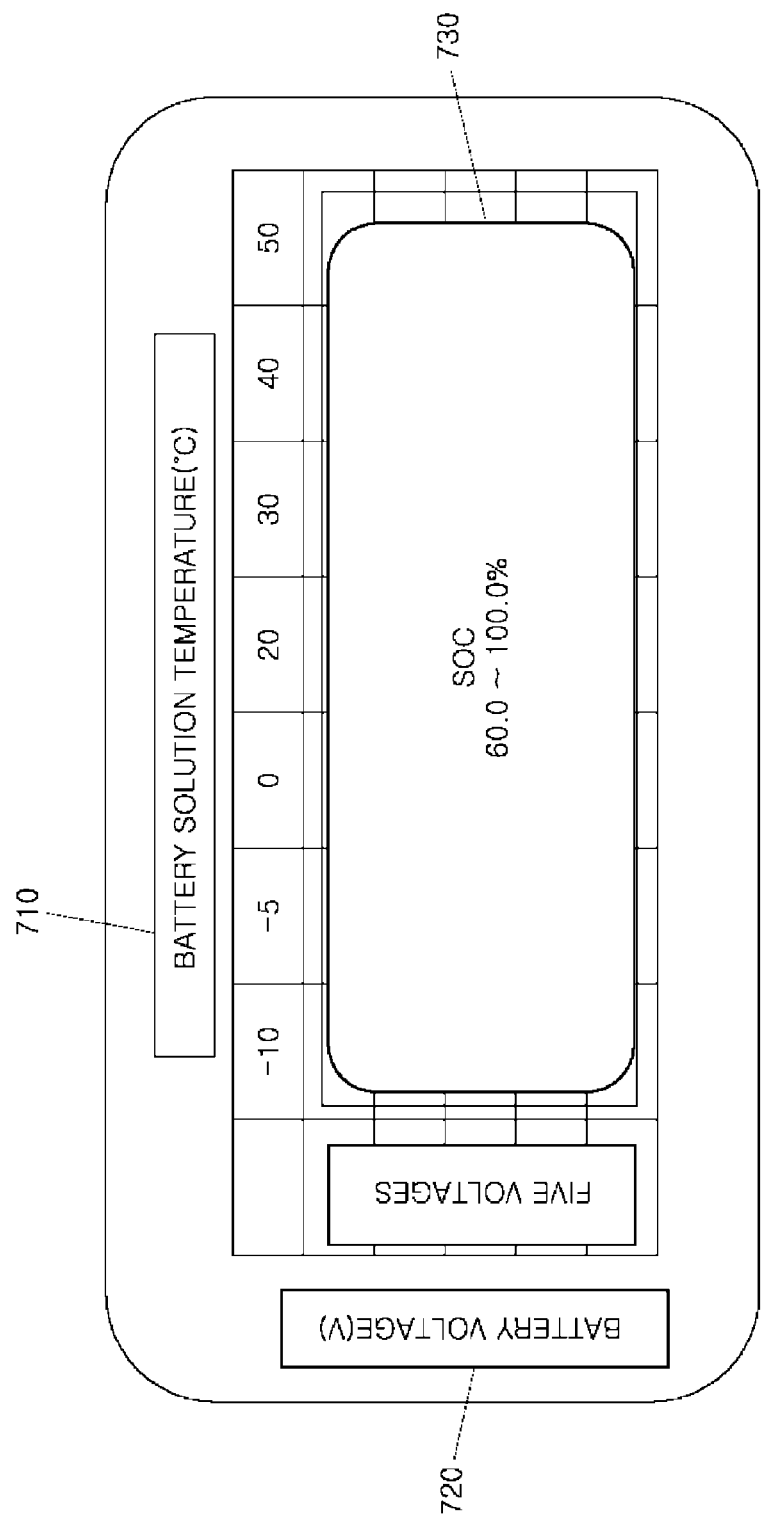
FIG. 7 is an exemplary conceptual diagram of a second temperature voltage map illustrated in FIG. 2 in according with an exemplary embodiment of the present invention.

FIG. 7 is an exemplary conceptual diagram of the second temperature voltage map 312 illustrated in FIG. 2. Referring to FIG. 7, a battery solution temperature 710 is indicated in a horizontal direction and a battery voltage 720 is indicated in a vertical direction. A combination of the battery solution temperature 710 and the battery voltage 720 may be matched with the corresponding calibrated state of battery information (SOC) 730. In the case of FIG. 7, the number of the battery voltage 720 is five and values therebetween are processed by the linear interpolation.

In accordance with the exemplary embodiments of the present invention, it may be possible to improve the accuracy of the state of battery information to about ±3 to 5% by additionally correcting the state of battery information generated by the sensor in the ready condition. Further, it may be possible to reduce the load of the low voltage converter in the parking, acceleration, and constant speed driving sections and increase the energy recovery in the deceleration driving section. In addition, it may be possible to strengthen the durability performance by improving the accuracy of the charge amount of the battery to more precisely control the charge or discharge amount.

The foregoing exemplary embodiments are merely examples to allow a person having ordinary skill in the art to which the present inventive concept pertains (hereinafter, referred to as "those skilled in the art") to easily practice the present invention. Accordingly, the present inventive concept is not limited to the foregoing exemplary embodiments and the accompanying drawings, and therefore, a scope of the present inventive concept is not limited to the foregoing exemplary embodiments. Accordingly, it will be apparent to those skilled in the art that substitutions, modifications and variations can be made without departing from the spirit and scope of the invention as defined by the appended claims and can also belong to the scope of the present invention.

What is claimed is:

1. An apparatus for controlling a converter, comprising:
a battery;
a sensor configured to sense the battery to generate sensor state of battery information;
a converter controller configured to:
  acquire the sensor state of battery information and vehicle state information received from a vehicle controller to calculate calibrated state of battery information based on whether a correction execution condition on the sensor state of battery information is satisfied;
  use the calibrated state of battery information and the sensor state of battery information to calculate an error correction value; and
  use the error correction value to calculate actual state of battery information; and
a converter configured to supply power to the battery based on the sensor state of battery information or the actual state of battery information.

2. The apparatus of claim 1, wherein the converter controller is further configured to:
use a preset temperature voltage map based on whether the correction execution condition is satisfied to calculate the calibrated state of battery information;
use the calibrated state of battery information and the sensor state of battery information to calculate the error correction value; and
use the error correction value and the sensor state of battery information to calculate the actual state of battery information.

3. The apparatus of claim 2, wherein in the calculation of the calibrated state of battery information the converter controller is configured to:
use a first temperature voltage map to calculate a battery current of the battery;
confirm whether the battery current is maintained for a predetermined period of time; and
use a second temperature voltage map to calculate the calibrated state of battery information when the battery current is maintained for the predetermined period of time.

4. The apparatus of claim 2, wherein the correction execution condition includes whether a sensor is operated normally, whether the sensor state of battery information is equal to or greater than a specific value, whether a ready time to activate the battery is equal to or greater than a specific time, whether voltage control prohibition is enabled, whether a refresh mode is enabled, and whether a battery long-term leaving mode is set.

5. The apparatus of claim 1, wherein the battery is an auxiliary battery.

6. The apparatus of claim 1, wherein the error correction value is a value obtained by subtracting the sensor state of battery information from the calibrated state of battery information.

7. The apparatus of claim 1, wherein the sensor is an intelligent battery sensor (IBS).

8. The apparatus of claim 3, wherein the first temperature voltage map is a battery current that matches a battery solution temperature of the battery and a battery voltage, and the second temperature voltage map is the calibrated state of battery information that matches the battery solution temperature of the battery and the battery voltage.

9. The apparatus of claim 1, wherein the sensor state of battery information, the calibrated state of battery information, and the actual state of battery information are any one of the group consisting of: a state of charge (SOC), a state of health (SOH), a depth of discharge (DOD), and a state of function (SOF).

10. The apparatus of claim 1, wherein the converter is a low voltage DC-DC converter (LDC).

11. A method for controlling a converter, comprising:
sensing, by a sensor, sensor state of battery information regarding a battery;
acquiring, by a converter controller, vehicle state information from a vehicle controller;
confirming, by the converter controller, whether a correction execution condition on the sensor state of battery information is satisfied using the sensor state of battery information and the vehicle state information;
calculating, by the converter controller, calibrated state of battery information using the sensor state of battery information based on whether the correction execution condition is satisfied;
calculating, by the converter controller, an error correction value using the calibrated state of battery information and the sensor state of battery information;
calculating, by the converter controller, actual state of battery information using the error correction value; and
supplying, by a converter, power to the battery based on the sensor state of battery information or the actual state of battery information.

12. The method of claim 11, wherein the calculation of the calibrated state of battery information includes:
calculating, by the converter controller, the calibrated state of battery information using a preset temperature voltage map in response to confirming that the correction execution condition is satisfied; and
using, by the converter controller, the sensor state of battery information as actual state of battery information in response to confirming that the correction execution condition is not satisfied.

13. The method of claim 12, wherein the calculation of the calibrated state of battery information includes:
calculating, by the converter controller, a battery current of the battery using a first temperature voltage map;
confirming, by the converter controller, whether the battery current is maintained for a predetermined period of time; and
calculating, by the converter controller, the calibrated state of battery information when the battery current is maintained for the predetermined period of time using a second temperature voltage map.

14. The method of claim 12, wherein the correction execution condition includes whether a sensor is operated normally, whether the sensor state of battery information is equal to or greater than a specific value, whether a ready time to activate the battery is equal to or greater than a specific time, whether voltage control prohibition is enabled, whether a refresh mode is enabled, and whether a battery long-term leaving mode is set.

15. The method of claim 11, wherein the error correction value is a value obtained by subtracting the sensor state of battery information from the calibrated state of battery information.

16. The method of claim 13, wherein the first temperature voltage map is a battery current that matches a battery solution temperature of the battery and a battery voltage, and the second temperature voltage map is the calibrated state of battery information that matches the battery solution temperature of the battery and the battery voltage.

17. The method of claim 11, wherein the sensor state of battery information, the calibrated state of battery information, and the actual state of battery information are any one of the group consisting of: a state of charge (SOC), a state of health (SOH), a depth of discharge (DOD), and a state of function (SOF).

18. A non-transitory computer readable medium containing program instructions executed by a controller, the computer readable medium comprising:
program instructions that control a sensor to sense sensor state of battery information regarding a battery;
program instructions that acquire vehicle state information from a vehicle controller;
program instructions that confirm whether a correction execution condition on the sensor state of battery information is satisfied using the sensor state of battery information and the vehicle state information;
program instructions that calculate calibrated state of battery information using the sensor state of battery information based on whether the correction execution condition is satisfied;
program instructions that calculate an error correction value using the calibrated state of battery information and the sensor state of battery information;
program instructions that calculate actual state of battery information using the error correction value; and
program instructions that supply power to the battery based on the sensor state of battery information or the actual state of battery information.

19. The non-transitory computer readable medium of claim 18, further comprising:
program instructions that calculate the calibrated state of battery information using a preset temperature voltage map in response to confirming that the correction execution condition is satisfied; and
program instructions that use the sensor state of battery information as actual state of battery information in response to confirming that the correction execution condition is not satisfied.

20. The non-transitory computer readable medium of claim 19, further comprising:
program instructions that calculate a battery current of the battery using a first temperature voltage map;
program instructions that confirm whether the battery current is maintained for a predetermined period of time; and
program instructions that calculate the calibrated state of battery information when the battery current is maintained for the predetermined period of time using a second temperature voltage map.

* * * * *